(12) United States Patent
Saito et al.

(10) Patent No.: US 6,807,971 B2
(45) Date of Patent: Oct. 26, 2004

(54) HEAT TREATMENT APPARATUS AND CLEANING METHOD OF THE SAME

(75) Inventors: Yukimasa Saito, Kanagawa (JP); Hitoshi Murata, Kanagawa (JP); Hiroyuki Yamamoto, Tokyo (JP)

(73) Assignee: Tokyo Electron Ltd., Tokyo (JP)

( * ) Notice: Subject to any disclaimer, the term of this patent is extended or adjusted under 35 U.S.C. 154(b) by 318 days.

(21) Appl. No.: 10/080,964

(22) Filed: Feb. 21, 2002

(65) Prior Publication Data

US 2002/0073923 A1 Jun. 20, 2002

Related U.S. Application Data

(62) Division of application No. 09/448,879, filed on Nov. 24, 1999, now Pat. No. 6,383,300.

(30) Foreign Application Priority Data

Nov. 27, 1998 (JP) ............................................. 10-337879

(51) Int. Cl.[7] .............................. B08B 7/00; B08B 9/00
(52) U.S. Cl. ......................... 134/22.11; 134/1; 134/1.3; 134/3; 134/21; 134/22.1; 134/22.11; 134/22.12; 134/22.18; 134/37; 134/42
(58) Field of Search .......................... 134/1, 1.3, 2, 3, 134/4, 21, 22.1, 22.11, 22.12, 22.18, 37, 42; 118/715, 724, 725; 156/345.29; 216/37, 58, 63; 438/694, 699, 703, 706

(56) References Cited

U.S. PATENT DOCUMENTS

| | | | | |
|---|---|---|---|---|
| 4,657,616 A | * | 4/1987 | Benzing et al. ........ | 156/345.43 |
| 5,584,963 A | * | 12/1996 | Takahashi ................. | 134/22.1 |
| 5,637,153 A | * | 6/1997 | Niino et al. ............. | 134/22.11 |
| 5,914,000 A | * | 6/1999 | Takahashi .............. | 156/345.29 |
| 6,015,503 A | * | 1/2000 | Butterbaugh et al. ......... | 216/66 |
| 6,055,927 A | * | 5/2000 | Shang et al. ......... | 118/723 ME |
| 6,159,298 A | * | 12/2000 | Saito .......................... | 118/715 |
| 6,274,058 B1 | * | 8/2001 | Rajagopalan et al. ......... | 216/67 |
| 6,383,300 B1 | * | 5/2002 | Saito et al. .................. | 118/715 |
| 6,583,065 B1 | * | 6/2003 | Williams et al. ............. | 438/714 |
| 6,664,119 B2 | * | 12/2003 | Choi et al. .................... | 438/14 |
| 2002/0073923 A1 | * | 6/2002 | Saito et al. ................. | 118/715 |

FOREIGN PATENT DOCUMENTS

| | | | |
|---|---|---|---|
| JP | 63-069220 | * | 3/1988 |
| JP | 4-333570 A | | 11/1992 |
| JP | 5-214339 A | | 8/1993 |

OTHER PUBLICATIONS

English computer translation of JP 05–214,339.*

* cited by examiner

*Primary Examiner*—Jeffrie R. Lund
(74) *Attorney, Agent, or Firm*—Crowell & Moring LLP

(57) ABSTRACT

A semiconductor wafer is contained in a reaction tube, and the reaction tube is exhausted through an exhaust pipe while supplying ammonia and dichlorosilane into the reaction tube. A silicon nitride film is deposited on an object to be heat-treated by a reaction of ammonia and dichlorosilane. Subsequently, TEOS is supplied into the reaction tube, while the reaction tube is exhausted through the exhaust pipe. A silicon oxide film is deposited on the object by resolving the TEOS. A semiconductor wafer an which a laminated layer of the silicon nitride film and the silicon oxide film is formed is unloaded from the reaction tube. Then, reactive products attached into the exhaust pipe and the reaction tube are removed, by conducting fluoride hydrogen thereinto, thereby cleaning the pipers The top end of the exhaust pipe is split into two vents, either one of which is used for discharging exhaust gas for forming films and the other one of which is used for discharging HF gas for cleaning the pipes.

12 Claims, 11 Drawing Sheets

HEAT TREATMENT APPARATUS AND CLEANING METHOD OF THE SAME

CROSS-REFERENCE TO RELATED APPLICATIONS

This is a division of application Ser. No. 09/448,879, filed Nov. 24, 1999, now U.S. Pat. No. 6,383,300, granted May 7, 2002.

BACKGROUND OF THE INVENTION

1. Field of the Invention

The present invention relates to a heat treatment apparatus and a cleaning method of the same, and more particularly to a heat treatment apparatus in which reactive products are prevented from attaching thereinto and a cleaning method of the same.

2. Description of the Related Art

A silicon oxide film ($SiO_2$ film) or a silicon nitride film ($Si_3N_4$ film) is used in various sections of a semiconductor device.

An $SiO_2$ film is produced by resolving alkoxysilane in a decompression CVD device, etc. An unreacted substance of alkoxysilane [$(SiC_xH_yO_z)_n$ x=0.1 to 2, y=1 to 15, z=0.1 to 5, n>0] attaches into the CVD device in a process for producing an $SiO_2$ film. Such a substance comes off in a process for forming a film, and becomes particles. This process has the drawback of lowering the quality of to-be-manufactured semiconductor devices and of having a low overall yield.

An $Si_3N_4$ film is produced by a reaction of, for example, ammonia ($NH_3$) and dichlorosilane ($SiH_2Cl_2$) in the CVD device. While a silicon nitride film is being formed, ammonia chloride ($NH_4Cl$) may be in a state of solidity in a low-temperature section of a reaction tube. If the ammonia chloride is sublimated when loading a semiconductor substrate and attaches to the semiconductor substrate, it becomes a source for particles to be formed on the surface of the substrate in a process for forming a film. Particles which have been formed as a result of a reaction of the sublimated ammonia chloride and moisture within the atmosphere attach onto the semiconductor substrate, resulting in a defective feature of the semiconductor device.

The temperature and the exhaust conductance of a manifold of a reaction tube, the periphery of an exhaust section and an exhaust pipe are lower than those of a film-forming area where a wafer boat is arranged. Therefore, a lot of reactive products are likely to attach into those sections.

Accordingly, the conventional heat treatment apparatus has been taken apart in order to clean its composing elements for large scale maintenance, while the operations of the apparatus are suspended for a long period of time. Therefore, only a low operational rate of the apparatus has been achieved.

In order to prevent the apparatus from being operated at a low operational rate while cleaning its composing elements, Unexamined Japanese Patent Application KOKAI Publication No. H5-214339 discloses a method of cleaning an apparatus forming silicon nitride films with using HF gas. In addition to this, Unexamined Japanese Patent Application KOKAI Publication No. H4-333570 discloses a method of cleaning an apparatus by removing nitrogen silicon therefrom with using HF gas. The references cited disclose merely a method of cleaning an apparatus by removing $(SiC_xH_yO_z)_n$ with using HF gas and by removing nitrogen silicon. In the references, no disclosure has been made to a method of forming films in a heat treatment apparatus and a method of cleaning the same. The references do not even disclose a technique for preventing HF gas used for the cleaning from contaminating the environment.

In various processes for manufacturing semiconductor devices, a two-layered film, such as $SiO_2/Si_3N_4$, etc. or three-layered film, such as $SiO_2/Si_3N_4/SiO_2$, etc. is used. Conventionally, an $SiO_2$ film and an $Si_3N_4$ film have been produced in different apparatuses. Thus when transferring a wafer from one apparatus to the other, a natural oxide film and particles obviously attach onto the surface of the wafer. Thus causes the problem of lowering the quality of to-be-manufactured semiconductor devices and of having a low overall yield Accordingly, it is preferred that an apparatus can from the $SiO_2$ film together with the $Si_3N_4$ film. However, no proposal has yet been made for an apparatus in which particles are prevented from attaching thereinto.

SUMMARY OF THE INVENTION

Accordingly, the present invention has been made in consideration of the above, in order to clean a heat treatment apparatus with efficiency.

An object of the present invention is to provide a method of efficiently cleaning an apparatus capable of producing various kinds of films.

Another object thereof is to provide a technique for cleaning a heat treatment apparatus with using HF gas while preventing the used HF gas from contaminating the environment.

In order to achieve the above objects, according to the first aspect of this invention, there is provided a heat treatment apparatus, comprising a reaction tube which can contain an object to be heat-treated;

an exhaust pipe, one end of which is connected to the reaction tube, for exhausting gas contained in the reaction tube;

a reactant-gas supplying pipe, which is conducted into the reaction tube, for supplying reactant gas into the reaction tube;

an HF-gas supplying section which includes an HF pipe connected to a gas source for hydrogen fluoride, an HF valve which controls to supply hydrogen fluoride from the gas source and which is arranged in the HF pipe, and an inlet which conducts, into the exhaust pipe and/or the reaction tube, the hydrogen fluoride supplied from the gas source through the HF pipe, wherein the HF valve is open and the hydrogen fluoride gas is conducted from the gas source into the exhaust pipe and/or the reaction tube, thereby cleaning inside of the exhaust pipe and/or the reaction tube.

In the structure, an inlet for supplying HF gas is arranged in the reaction tube separately from the reactant-gas supplying pipe. When an HF valve is open, HF gas can be conducted into the reaction tube and/or the exhaust pipe which can then be cleaned. Therefore, the heat treatment apparatus can be cleaned with simple treatments only.

In the structure disclosed in Unexamined Japanese Patent Application KOKAI Publication No. H5-214339, as shown in FIG. 2 included in the Publication, HF gas and reactant gas are conducted into a reaction tube from an identical gas-supplying section. Therefore, the reactant gas is fearfully contaminated in a process for forming a film.

Unexamined Japanese Patent Application KOKAI Publication No. H4-333570 suggests (1) a method for conducting HF gas into an apparatus which can form thin films and (2) a method for conducting HF gas into a cleaning apparatus by inserting the apparatus itself into the cleaning apparatus. However, no disclosure has been made to a "structure for efficiently conducting HF gas into the apparatus so as to clean the apparatus".

The other end of the exhaust pipe may be split into a first and second vents; and a valve may be arranged between the first and second vents, may conduct exhaust gas into the second vent when HF gas is exhausted, and conduct exhaust gas into the first vent when no HF gas is exhausted.

According to this structure, the products produced while forming a film and the HF gas used for cleaning the apparatus can separately be heat-treated. An HF gas scrubber may be used as the second vent, whereas a scrubber for any other kind of gas may be used as the first vent.

In the heat treatment apparatus, there may be arranged a plurality of traps which are arranged on the exhaust pipe and which remove a reactive product within the exhaust pipe, and a pressure control valve which is arranged between the plurality of traps and which maintain pressure within the reaction tube and the exhaust pipe at a fixed value.

It is necessary to maintain the pressure within the reaction tube and the exhaust pipe at an appropriate value in order to form a film and clean any part of the apparatus. The pressure control valve controls the pressure by itself or together with any other device. Since the pressure control valve is arranged between the plurality of traps, the reactive products are prevented from attaching to the pressure control valve (normally, the reactive products easily attach thereto).

The reaction tube includes an inner tube, whose upper end is open, and an outer tube, which surrounds the inner tube with a predetermined space and whose upper ends is closed. In this case, it is preferred that the inlet conducts HF gas into the inner tube, and the exhaust pipe is connected to the outer tube and exhausts gas from the gap between the inner and outer tubes. In having such a structure, the HF gas from the inlet cleans inside of the inner tube toward the upper end of the inner tube, and reaches the exhaust pipe through the space between the inner tube and the outer tube. Thus, cleaning what is so-called "vertical double tubes" can be performed with efficiency.

It is preferred that the inlet is arranged in a position adjacent to an intake (the most upstream side) of the exhaust pipe. Conductance varies in the portion through which exhaust gas passes from the reaction tube to the exhaust pipe. This results in reactive products easily attaching into the periphery of the intake of the exhaust pipe. When the inlet is thus arranged in a position adjacent to the intake of the exhaust pipe, the products which have attached into a bent part can be removed with efficiency.

In a case where the exhaust pipe includes at least one bent part, it is preferred that the inlet is arranged on an upstream side of a gas-flowing path and adjacent to the bent part of the exhaust pipe. Conductance of the bent part is low, therefore, a reactive product is likely to attach to the part. If the inlet is arranged adjacent to the bent part on the upstream side of the gas-flowing path, the products which have attached to the bent part can be efficiently removed.

In a case where the trap is arranged on the exhaust pipe, the inlet is preferably arranged adjacent to the trap on the upstream side of the gas-flowing path. Conductance of the trap is also low, therefore, a reactive product easily attaches thereto. If the inlet is arranged adjacent to the trap on the upstream side, the products which have attached to the trap can be efficiently removed.

The reactant-gas supplying pipe conducts alkoxysilane into the reaction tube in order to form a silicon oxide film on the object, and/or conducts ammonia and a silicon compound (for example, monosilane ($SiH_4$), dichlorosilane ($SiH_2Cl_2$), silicon tetrachloride (SiCl4)) into the reaction tube in order to form a silicon nitride film on the object, and the reaction tube forms a silicon oxide film on the object by resolving alkoxysilane, and/or forms a silicon nitride film on the object by a reaction of ammonia and a silicon compound.

In such a structure, a silicon oxide film and a silicon nitride film can successively be formed in a single one heat treatment apparatus. Furthermore, the products produced in the process for forming the silicon oxide film and the products produced in the process for forming the silicon nitride film are efficiently removed with using HF gas.

The exhaust pipe may include an $SiO_2$ product trap (for example, a disk trap), in the exhaust pipe, which removes a reactive product produced by resolving alkoxysilane within the exhaust pipe, an SiN product trap (for example, a water trap) which removes a reactive product produced by a reaction of ammonia and a silicon compound within the exhaust pipe; and a heater which heats up the $SiO_2$ product trap in a range between 100 to 150° C.

The pressure control valve is preferably arranged between the $SiO_2$ product trap and the SiN product trap and is heated up by the heater.

The pressure control valve is preferred to maintain the pressure within the exhaust pipe at a pressure value of 10 kPa or higher.

The apparatus may further include a heater which heats up the exhaust pipe in a range from 100 to 200° C.

The apparatus may further include a heater which heats up the reaction tube and which heats up the exhaust pipe in a range from 100 to 200° C.

The apparatus may further include a pressure controller which controls pressure of hydrogen fluoride within the exhaust pipe to be fluctuated. The pressure of the hydrogen fluoride within the exhaust pipe is fluctuated, therefore, the hydrogen fluoride spreads over the exhaust pipe even in a part where the conductance is low or in a dead space (a part, such as a cavity, a space between connected portions, etc., through which gas does not flows), resulting in cleaning the entire apparatus evenly.

The pressure controller controls the pressure within the exhaust pipe to be fluctuated in a range, for example, 0.1 kPa to 30 kPa. Since the pressure is fluctuated in such a range, the hydrogen fluoride thus spreads over.

The pressure controller is preferred to control the pressure within the exhaust pipe to be fluctuated in such a way that a period at which the pressure is 10 kPa or higher and a period at which the pressure is lower than 10 kPa are cyclically repeated, and that the period at which the pressure is 10 kPa or higher can be obtained longer than the period at which the pressure is less than 10 kPa.

The heat treatment apparatus of this invention may further include a purge-gas supplying section which supplies purge gas into the exhaust pipe and/or the reaction tube; and a controller which repeats, after the HF-gas supplying section stops supplying hydrogen fluoride, a plurality of cycles of exhausting and supplying purge gas into the exhaust pipe and/or the reaction tube by the purge-gas supplying section and the exhaust pipe, and which supplies film-forming gas by the film-forming gas supplying section during the plurality of cycles.

The HF gas is preferred to be purged immediately after cleaning is completely performed. In the above structure, the film-forming gas is supplied during the plurality of cycles of exhausting and supplying the purge gas into the exhaust pipe, thus, the exhaust pipe can be purged of the exhaust gas in a short time.

The film-forming gas supplying section supplies alkoxysilane as the film-forming gas, while the purge-gas supplying section supplies nitrogen gas as purge gas.

According to the second aspect of the present invention, there is provided a method of cleaning at least one of a reaction tube which is included in a heat treatment apparatus and an exhaust pipe which is connected to the reaction tube, the method comprising:

a loading step of loading an object to be heat-treated into the reaction tube;

a first film-forming step of forming a first film on the object, by supplying first reactant gas into the reaction tube;

a second film-forming step of forming a second film on the object, after stopping supplying the first reactant gas into the reaction tube and supplying second reactant gas which differs from the first reactant gas; and a cleaning step of removing a product produced in the first film-forming step and a product produced in the second film-forming step which have attached to at least one of the reaction tube and the exhaust pipe, by exhausting gas contained in the reaction tube through the exhaust pipe and supplying hydrogen fluoride gas into at least one of the reaction tube and the exhaust pipe.

During the cleaning process, it is preferred that the method includes a raising step of raising temperature of the reaction tube and heating up the exhaust pipe in a range from 100 to 200° C.; and a maintaining step of maintaining pressure within the exhaust pipe in a range between 10 kPa to 30 kPa.

The method may comprise a cleaning step of cleaning at least one of the reaction tube and the exhaust pipe by supplying hydrogen fluoride gas thereinto, while controlling the pressure within the exhaust pipe to be fluctuated in a range between 0.1 kPa and 30 kPa.

In this case, it is preferred that the method comprises a controlling step of controlling pressure within the exhaust pipe to be fluctuated in such a way that a period at which the pressure is 10 kPa or higher and a period at which the pressure is less than 10 kPa are cyclically repeated, and that the period at which the pressure is 10 kPa or higher can be obtained longer than the period at which the pressure is less than 10 kPa.

The film-forming step includes a step of forming, on an object to be heat-treated, a silicon oxide film by resolving alkoxysilane, and the second film-forming step includes a step of forming, on the object, a silicon nitride film by a reaction of ammonia and a silicon compound.

In this case, the cleaning step includes a step of exhausting the reaction tube through the exhaust pipe and a step of supplying hydrogen fluoride into at least one of the reaction tube and the exhaust pipe, thereby removing a reactive product which is produced by resolving alkoxysilane and a reactive product which is produced by a reaction of ammonia and a silicon compound and both of which have attached to at least one of the reaction tube and the exhaust pipe.

Impurities being exhausted are removed in various positions of the exhaust pipe by a trap, and pressure of hydrogen fluoride gas is controlled in a position between the plurality of traps, by controlling an opening degree of a gas-flowing path of the exhaust pipe.

The exhaust pipe is decompressed, after supplying the hydrogen fluoride gas, film-forming gas is supplied into at least one of the reaction tube and the exhaust pipe, after repeating supplying purge gas and decompressing the exhaust pipe for a given number of times, and supplying purge gas and decompressing the exhaust pipe are repeated for a given number of times again, thereby removing the hydrogen fluoride gas.

In this case, the purge gas is composed of nitrogen gas, etc., while the film-forming gas includes alkoxysilane, etc.

BRIEF DESCRIPTION OF THE DRAWINGS

These objects and other objects and advantages of the present invention will become more apparent upon reading of the following detailed description and the accompanying drawings in which:

FIG. 8A is a cross section of a manifold and an exhaust pipe, whereas FIG. 8B is a cross section of an exhaust port;

DETAILED DESCRIPTION OF THE PREFERRED EMBODIMENTS (First Embodiment)

Preferred embodiments of the present invention will now be explained with reference to the accompanying drawings.

Figure 1:
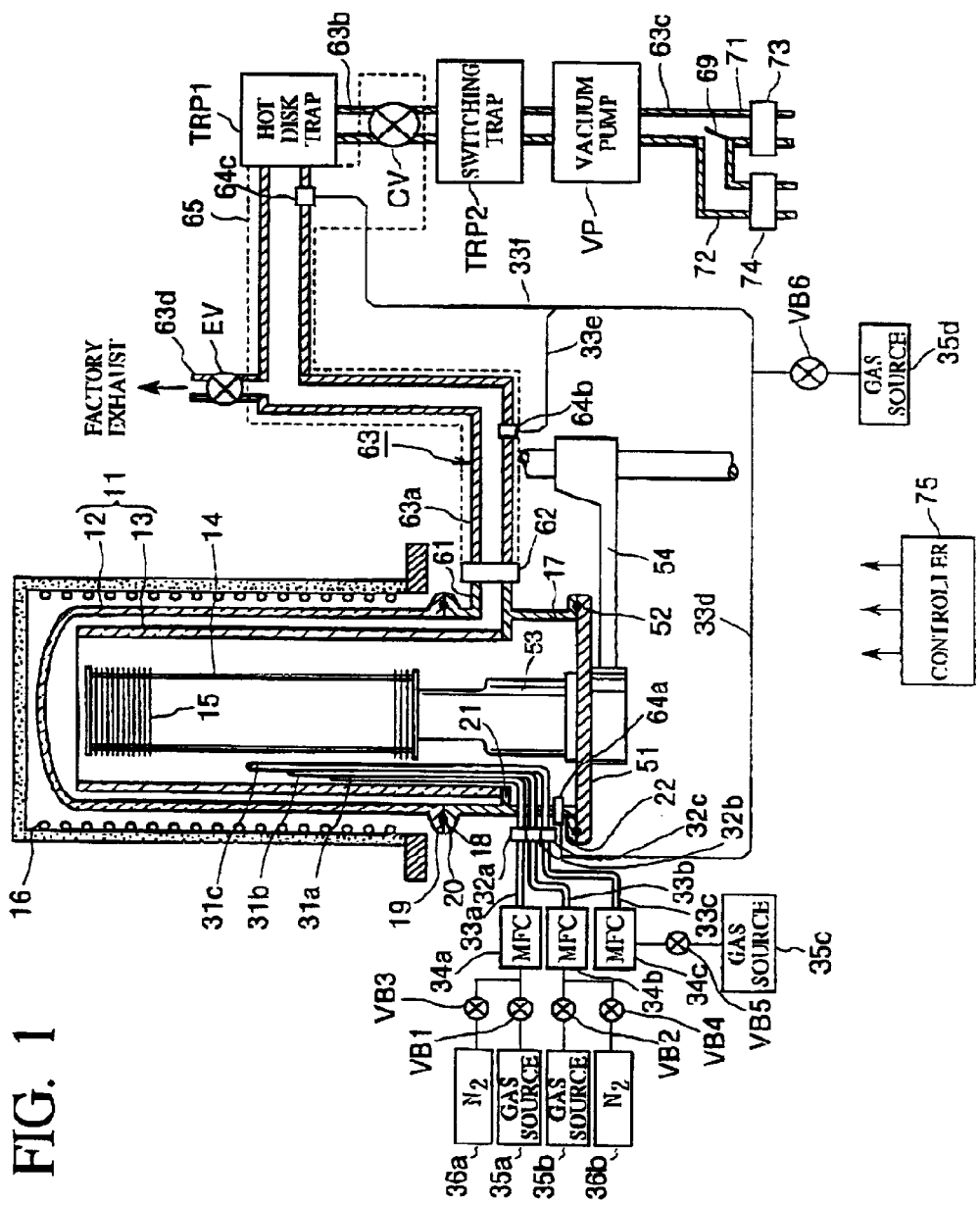
FIG. 1 is a diagram showing the structure of a vertical heat treatment apparatus according to the first embodiment of the present invention.

FIG. 1 illustrates the structure of a vertical heat treatment apparatus according to the first embodiment of the present invention.

This vertical heat treatment apparatus is one capable of forming both a silicon nitride film and a silicon dioxide film. The vertical heat treatment apparatus of this invention includes a cylindrical reaction tube (reaction chamber) 11 with long sides held in vertical. The reaction tube 11 has the double-tube structure having an outer tube 12 with an open lower end and an inner tube 13 with an open upper and lower end. The outer tube 12 is made of a thermal resistance material, such as quartz, etc. The inner tube 13 is formed in a concentric circle inside the outer tube 12 at an appropriate distance away from the inner wall of the outer tube 12.

A wafer boat (boat for heat treatment) 14, made of quartz or the like, is arranged in the reaction tube 11. A plurality of semiconductor substrates (semiconductor wafers) 15 as objects to be heat-treated are perpendicularly deposited at predetermined intervals in the wafer boat 14.

A heater 16, which is made of a resistance heating element, etc., is so formed as to surround the circumference of the reaction tube 11.

A manifold 17 is so arranged under the outer tube 12 as to support the outer and inner tubes 12 and 13. The manifold 17 is made of, for example, stainless steel, $SiO_2$, SiC, etc.

A flange 18 is annularly formed in the upper portion of the manifold 17, and is hermetically connected to a flange 19 which is formed in the lower portion of the outer tube 12 via an "O" ring 20 made of elastic materials. The lower portion of the inner tube 13 is placed on a support 21 which is projected inward from the inner wall of the manifold 17.

First to third gas supplying pipes 31a, 31b and 31c, which are made of quartz, etc. and are bent toward a heat treatment area (upward), are hermetically sealed in one side of the manifold 17 with using a seal agent.

The first gas supplying pipe 31a is connected to a gas pipe 33a via a joint 32a. The first gas pipe 33a is connected to a first gas source 35a via a mass flow controller (MFC) adjusting an amount of flowing gas and a valve VB1 controlling the flow of gas. The first gas source 35a is a gas source for supplying a silicon compound such as dichlorosilane ($SiH_2Cl_2$), monosilane ($SiH_4$), silicon tetrachloride ($SiCl_4$), etc. The first gas pipe 33a is connected also to a nitrogen gas source 36a via an MFC 34a and a valve VB3.

The second gas supplying pipe 31b is connected to a second gas pipe 33b via a joint 32b. The second gas supplying pipe 33b is connected to a second gas source 35b via an MFC 34b adjusting an amount of flowing gas and a valve VB2 controlling gas to flow or not to flow. The second gas source 35b is a gas source for supplying ammonia ($NH_3$). The second gas pipe 33b is connected also to a nitrogen gas source 36b via the MFC 34b and a valve VB4.

The third gas supplying pipe 31c is connected to a third gas pipe 33c via a joint 32c. The third gas pipe 33c is connected to a third gas source 35c via an MFC 34C and a valve VB5. The third gas source 35c is a gas source for supplying alkoxysilane, preferably tetraethoxysilane (hereinafter referred to merely as TEOS).

A lid (cap) 51 formed in a disk-like shape is hermetically connected to a flange 22 formed in the lower portion of the manifold 17 through an "O" ring 52 made of an elastic material, etc. A heat insulating cylinder 53 on which the wafer boat 14 is placed is arranged on the upper surface of the lid 51. The lid 51 is attached to an elevator mechanism 54 which moves upward and downward in order to load and unload the heat insulating cylinder 53 and the wafer boat 14 into the reaction tube 11.

An inlet 64a for conducting hydrogen fluoride (HF) (for cleaning) into the reaction tube 11 is connected to the lower side of the manifold 17. Further, the inlet 64a is connected via a fourth gas pipe 33d and the valve VB6 to a fourth gas source 35d as a gas source for supplying hydrogen fluoride.

The fourth gas source 35d is connected also to an inlet 64b via the valve VB6 and a fifth gas pipe 33e, and also to an inlet 64c via the valve VB6 and a sixth gas pipe 33f.

An exhaust port 61 is connected to the other side of the manifold 17. The exhaust port 61 is made of stainless steel, etc. and is connected via a joint 62 to an exhaust pipe 63 for exhausting exhaust gas.

The exhaust pipe 63 includes pipes 63a to 63c. The pipe 63a is connected to the exhaust port 61 via the joint 62 so that exhaust gas from the reaction tube 11 is conducted into the pipe 63b. The pipe 63b is so connected that exhaust gas is conducted from a hot disk trap TRP1 into an intake of a vacuum pump VP subsequently via a combination valve CV and a switching trap TRP2. One end of the pipe 63c is connected to the intake of the vacuum pump VP, whereas the other end thereof is split into two vents 71 and 72.

A factory exhaust pipe 63d for conducting exhaust gas passing through the pipe 63a out of the pipe 63d is connected to a predetermined position of the pipe 63a. The factory exhaust pipe 63 is composed of a factory exhaust valve EV, which can be opened and closed, and a non-illustrative damper, etc.

The vertical heat treatment apparatus of this invention includes an exhaust path heater 65 for heating the pipe 63a and the combination valve CV.

The pipe 63a are bent in some points. The inlet 64b for conducting hydrogen fluoride into the pipe 63a is connected onto the upstream side peripheral to one bent point of the pipe 63a. The inlet 64b is connected to the fourth gas source 35d via the fifth gas pipe 33e and the valve VB6.

An inlet 64c for conducting hydrogen fluoride into the hot disk trap TRP1 is connected onto the upstream side peripheral to a gas intake of the hot disk trap TRP1. The inlet 64c is connected to the fourth gas source 35d via the sixth gas pipe 33f and the valve VB6.

The hot disk trap TRP1 absorbs hydrocarbon $C_xH_y$ (x and y are both natural numbers), etc., produced when producing $SiO_2$ from TEOS. The hot disk trap TRP1 includes a housing, a disk assembly, a cover and a heater. A gas intake and a gas exit through which exhaust gas flows in and out are arranged on the both sides of the housing. Contained in the housing are a disk assembly and a cover in the housing.

The gas intake of the hot disk trap TRP1 is connected to the pipe 63a, while the gas exit is connected to the combination valve CV via the pipe 63b.

The disk assembly formed in a cylindrical shape are open in its both ends. The disk assembly contains a plurality of disks, made of an adsorbent, etc., which are perpendicularly arranged at predetermined intervals in a direction from the gas intake to the gas exit. The cover of the disk assembly covers the open end on the side of the gas intake.

The heater heats up the disks so that $NH_4Cl$ is prevented from attaching to the disks contained in the disk assembly. The heater can be structured as to surround the circumference of the housing or can be arranged inside the housing.

Gas from the gas intake flows into a gap between the disk assembly and the housing, passes through gaps between the disks, flows into an inner space of the disk assembly, and is discharged from the gas exit. The hydrocarbon $C_xH_y$, etc., as a reactive product which is produced when producing $SiO_2$ from TEOS, is attached to each disk while the exhaust gas is passing through the gaps between the disks.

The switching trap TRP2 is used for absorbing $NH_4Cl$ from the exhaust gas. The switching trap TRP2 includes a plurality of water-cooled traps, which are arranged in parallel with each other and absorb $NH_4Cl$ from the exhaust gas passing through the disk assembly, a switch and a cleaning room.

Each of the water-cooled traps included in the switching trap TRP2 includes a housing, a cooling device and an in/outflow section. The housing of each water-cooled trap has a gas intake through which the exhaust gas flows in and a gas exit through which the exhaust gas flows out. The cooling device of each water-cooled trap is arranged within the housing. The in/outflow section of each water-cooled trap is a section through which cool water circulating through the cooling device flows in and out. The cooling device includes a cool water circulator, which cools down by applying cool water thereto, and a plurality of cooling fins, which are arranged on the surface of the cool water circulator.

The gas from the gas intake hits the cooling device and contacts the cooling fins, thereby cooling down. By doing this, ammonium chloride $NH_4Cl$, to be separated from the exhaust gas as a result of the cooling, as a reactive product produced when a silicon nitride film is produced by a chemical reaction of ammonia and dichlorosilane is deposited on the cooling device. The exhaust gas from which $NH_4Cl$ has been removed is discharged from the gas exit into the vacuum pump VP.

When the exhaust gas passes through one of the water-cooled traps included in the switching trap TRP2, the switch causes the exhaust gas to pass through another trap in accordance with operations of an operator. Subsequently, the exhaust gas flowing through the trap through which the exhaust gas has been already flowing is interrupted under the control of the switch which then connects the trap to the cleaning room. Then, water stored in the cleaning room is pressurized by a pump included in the cleaning room and flows into the trap connected to the cleaning room. The water which has flowed thereinto cleans $NH_4Cl$ contained in the trap, flows back to the cleaning room and is discharged from the cleaning room, thereafter fresh water is stored in the cleaning room.

In repeating the above steps, each of the water-cooled traps of the switching traps TRP2 is cleaned while the exhaust gas is passing through any other trap. Therefore, the switching trap TRP2 lets the exhaust gas continuously flow therethrough, and absorbs $NH_4Cl$ from the exhaust gas.

The combination valve CV includes a valve, a valve controller and a pressure detector and is arranged for automatically controlling pressure within the reaction tube 11.

The pressure detector detects the pressure within the pipes 63a and 63b and informs the valve controller of the detected pressure. The valve controller adjusts an opening degree of the valve in such a way that the pressure detected by the pressure detector reaches a predetermined value. Furthermore, the valve controller controls an amount of the flowing exhaust gas which flows from the hot disk trap TRP1 into the switching trap TRP2. Thus, the pressure within the pipes 63a and 63b is controlled at an optional (or desired) value by the combination valve CV.

The combination valve CV adjusts and maintains the pressure in the pipes 63a and 63b at an arbitrary value substantially in a range between 0 and 1013 hpa, without using any other valve arranged in parallel to the combination valve CV.

A mechanism for opening and closing the path through which the exhaust gas flows can be simply structured with using the combination valve CV. Thus, the path does not necessarily have the structure, which includes a plurality of valves or pipes for conducting the exhaust gas in parallel to the plurality of valves, and which is so complicated as to cause the conductance of the path to be lowered. As a result of this, it becomes possible to prevent the path from including a portion where the conductance is low and to restrain an increase in a portion where products to be produced is attached.

The vacuum pump VP includes the intake and the vent, and has a displacement volume of approximately 15000 to 20000 liter/min.

One end of the pipe 63c is connected to the vent of the vacuum pump VP. The other end of the pipe 63c is split into two, one of which is the first vent 71 and the other one of which is the second vent 72. The first vent 71 is used for exhausting the exhaust gas when producing a silicon oxide film $SiO_2$ and a silicon nitride film $Si_3N_4$. The second vent 72 is used for exhausting hydrogen fluoride gas used for cleaning. The pipe 63c includes a valve 69, which switches the first and second vents 71 and 72 from one to the other, thereby discharging the exhaust gas discharged from the vacuum pump VP.

A first scrubber 73 which scrubs an unreacted substance $(SiC_xH_yO_z)_n$, ammonium chloride ($NH_4Cl$), ammonia, etc. is arranged in the first vent 71. A second scrubber 74 which scrubs hydrogen fluoride, etc. is arranged in the second vent 72.

All of the heater 16, the mass flow controller 34a to 34c, the combination valve CV, the gas sources 35a to 35d, 36a and 36b, the valves VB1 to VB6, the elevator mechanism 54, the vacuum pump VP and the exhaust path heater 65 are connected to a controller 75 which controls those all. The controller 75 measures the temperature and the pressure of each part of the vertical heat treatment apparatus using a sensor. Further, the controller 75 automatically controls a series of processes, as will be explained later, by sending a control signal, etc., to each part of the apparatus.

An explanation will now be made to exemplary operations of the vertical heat treatment apparatus, wherein a silicon oxide film $SiO_2$ and a silicon nitride film $Si_3N_4$ are formed, thereafter the inner part of the vertical heat treatment apparatus is cleaned.

A series of processes, as will be explained below, are carried out and automatically controller controlled by the controller 75.

Figure 2:
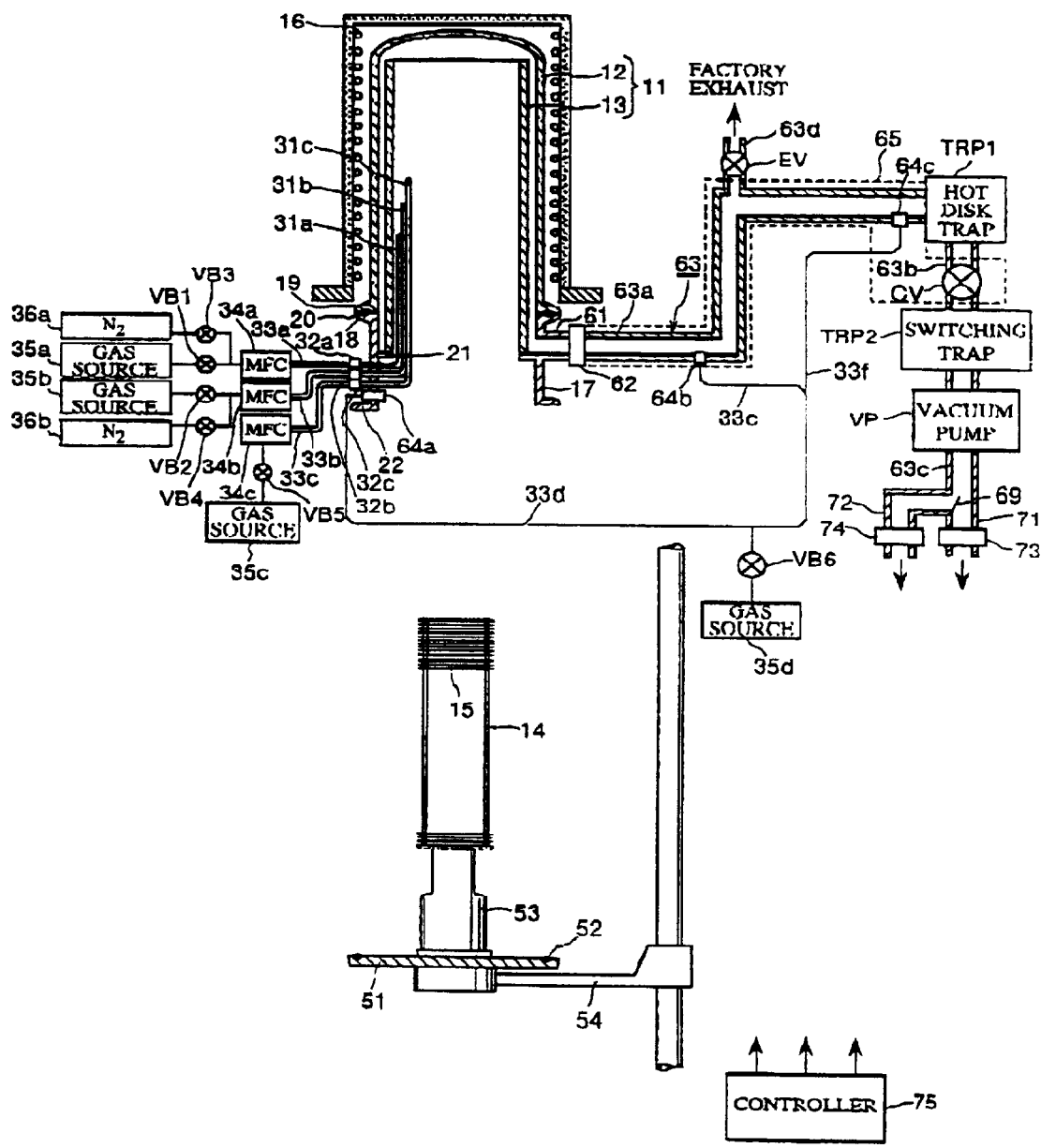
FIG. 2 is a diagram showing the vertical heat treatment apparatus which is shown in FIG. 1 and from which a wafer boat for heat treatment is unloaded.

As illustrated in FIG. 2, in a case where the elevator mechanism 54 is lowered down, the wafer boat 14 containing the semiconductor substrates (wafers) 15 is placed on the heat insulating cylinder 53 on the lid 51. In this case, the heater 16 is heated in a range approximately between 700° C. and 800° C.

Figure 3:
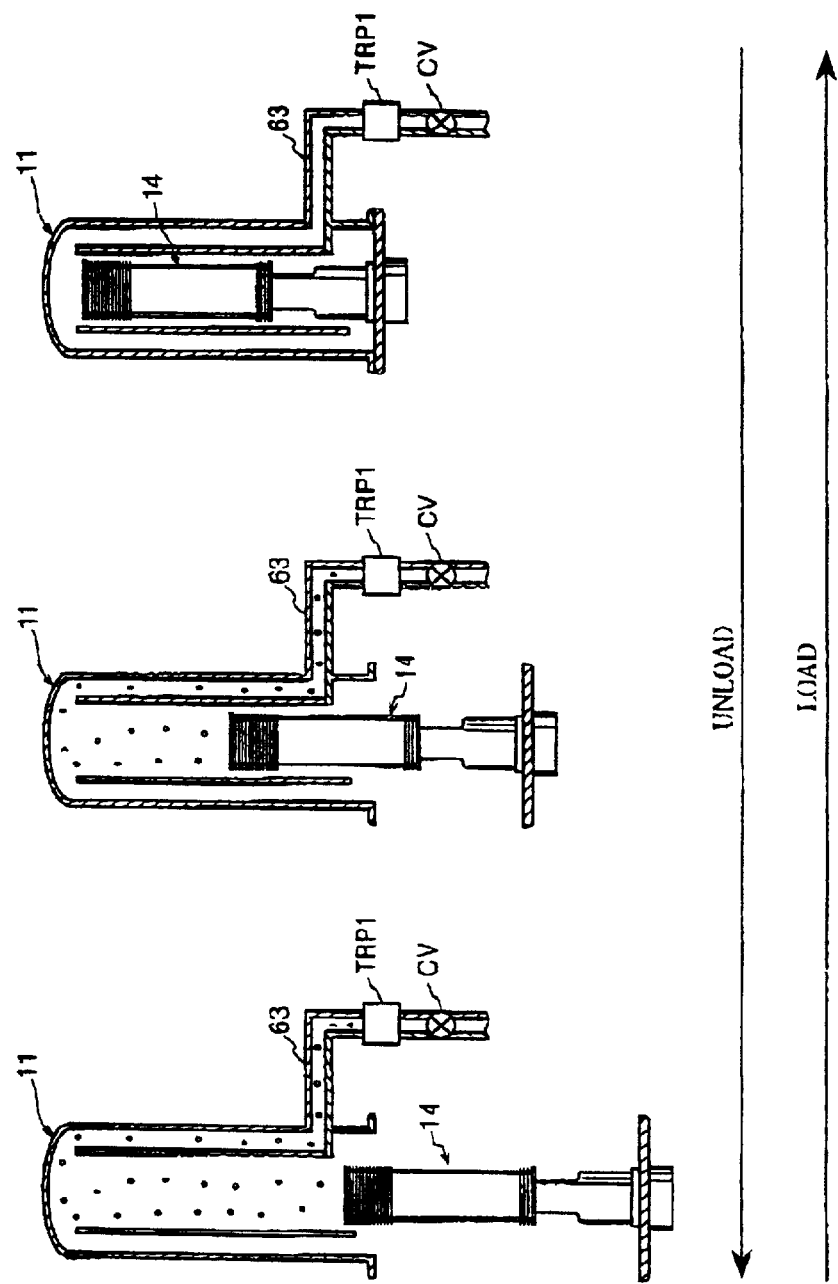
FIG. 3 is a diagram exemplifying a state in which particles contained in a reaction tube are exhausted.

In a case where the elevator mechanism 54 is lifted, the lid 51 and the wafer boat 14 are moved upward, thereby loading the wafer boat 14 into the reaction tube 11. In this case, the vacuum pump VP is operated and the opening degree of the combination valve CV is controlled, in a state where the factory exhaust valve EV is closed. Then, the wafer boat 14 is loaded while the gas inside the reaction tube 11 is absorbed at a pressure of approximately −500 Pa with respect to the (atmosphere) pressure inside the reaction tube 11. As exemplarily illustrated in FIG. 3, particles in the reaction tube 11 are absorbed, therefore, the particles are prevented from being attached to the semiconductor substrates 15.

Upon completion of loading the wafer boat 14 into the reaction tube 11, the flange 22 formed under the manifold 17 and the lid 51 are hermetically connected with each other via the "O" ring 52. In this case, the opening degree of the combination valve CV is controlled and slow exhaustion is performed along the pipes (i.e., at an exhaustion speed at which the reactive products on the semiconductor substrates 15 to be heat-treated and the reactive products inside the reaction tube 11 are not messed up). Thereafter, the reaction tube 11 is decompressed at a predetermined pressure value, for example, in a range between 0.5 and 0.7 Pa.

If the pressure within the reaction tube 11 reaches a predetermined value, the valves VB1 and VB2 are open. Then, NH3 and SiH2Cl2 are supplied respectively from the first gas source 35a and the second gas source 35b into the reaction tube 11, and the temperature of the semiconductor substrates 15 is controlled in a range between 600° C. and 700° C. The exhaust path heater 65 heats the pipe 63a and the combination valve CV to a temperature in a range approximately between 100° C. and 150° C. The valve 69 of the pipe 63c selects a path through which the exhaust gas can be exhausted after being scrubbed through the first scrubber 73 from the first vent 71.

Furthermore, the opening degree of the combination valve CV is controlled, thereby the exhaust gas is continuously exhausted while the pressure within the reaction tube 11 is controlled in a range between 25 Pa and 50 Pa. Such a state where the pressure in the reaction tube 11 is thus controlled is maintained for a predetermined time period, for example, two hours or so.

Meanwhile, a reaction takes place in the reaction tube 11, and a silicon nitride film ($Si_3N_4$ film) is formed on the surface of each semiconductor substrate 15. The reaction is represented by the following chemical formula (1).

$$10NH_3 + 3SiH_2Cl_2 \rightarrow Si_3N_4 + 6NH_4Cl + 6H_2 \qquad (1)$$

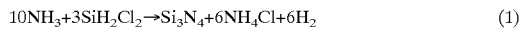

While the silicon nitride film is formed thereon, the heater of the hot disk trap TRP1 heats each disk contained in the hot disk trap TRP1 to a temperature between 100° C. and 150° C. By doing this, it becomes preventable that the exhaust gas cools off by the disks. Moreover, $NH_4Cl$ included in the exhaust gas is prevented from attaching to the disks.

During the formation of the film, $NH_4Cl$ contained in the exhaust gas cools down and is collected in the switching trap TRP2.

The exhaust gas flowing from the switching trap TRP2 is absorbed by the vacuum pump VP, and scrubbed by the scrubber 73 arranged in the first vent 71 of the pipe 63c, thereby being exhausted therefrom.

In addition to the above, in the meantime, $Si_3N_4$ and a very small amount of $NH_4Cl$ as reactive products are attached to the inner wall of the reaction tube 11, the manifold 17, the exhaust pipe 61, the pipe 63, the traps TRP1 or TRP2 or the combination valve CV.

When the silicon nitride film $Si_3N_4$ is completely formed, the valves VB1 and VB2 are closed, and $NH_3$ and $SiH_2Cl_2$ are no longer supplied into the reaction tube 11. Then, while the vacuum pump VP is being driven, the opening degree of the combination valve CV is controlled so that slow exhaustion can be performed along the pipes. Then, the reaction tube 11 is decompressed approximately at a pressure value of 0.1 Pa.

When the pressure in the reaction tube 11 reaches a predetermined value, the valve VB5 is open, so that alkoxysilane (preferably TEOS) can be supplied into the reaction tube 11 from the third gas source 35c. At the same time, the temperature of the semiconductor substrates 15 is controlled at a temperature of approximately 700° C. by the heater 16. The exhaust path heater 65 retains the temperature of the pipe 63a and the combination valve CV in a range between 100° C. and 150° C. Thereafter, the opening degree of the combination valve CV is controlled, and the exhaust gas is continuously exhausted while the pressure within the reaction tube 11 is controlled at a pressure value of 50 Pa. Such a state where the pressure in the reaction tube 11 is thus controlled is maintained for a predetermined time period, for example, twenty minutes or so.

In a case where TEOS is to be supplied from the third gas source 35c, a reaction occurs in the reaction tube 11, thereby a silicon oxide film ($SiO_2$ film) is formed on the surface of each semiconductor substrate 15. The reaction is represented by the following chemical formula (2).

$$TEOS \rightarrow SiO_2 + C_xH_y + H_2O \qquad (2)$$

where x and y are both natural numbers.

Since the exhaust conductance is decreased in the hot disk trap TRP1, hydrocarbon $C_xH_y$ contained in the exhaust gas is attached to the disks and removed from the exhaust gas.

The exhaust gas contains $NH_4Cl$ owing to sublimation of $NH_4Cl$ attached to periphery of the manifold 17 or the exhaust pipe 61, which is at a relatively low temperature, during the time the $Si_3N_4$ film was formed. However, because the heater of the hot disk trap TRP1 heats up the disks included in the hot disk trap TRP1 in a range from 100° C. to 150° C., $NH_4Cl$ is collected by the switching trap TRP2 without attaching to the disks.

The exhaust gas flowing from the switching trap TRP2 is scrubbed by the first scrubbers 73 and exhausted therefrom, after being supplied from the first vent 71, which is selected by the valve 69 of the pipe 63c, via the vacuum pump VP.

It should be noted that, during the formation of the film, silicon oxide $SiO_2$ attaches to the inner wall of the reaction tube 11. A certain amount of silicon oxide $SiO_2$ or hydrocarbon $C_xH_y$ attaches to such a section in which the conductance is low or dynamically varies or to the dead space on the gas-flowing path, as the lower portion of the manifold 17, the exhaust port 61, the bent portion of the pipe 63a or the inner section of the hot disk trap TRP1.

After the film is completely formed, the valve VB5 is closed, so that TEOS is no longer supplied into the reaction tube 11. Then, the reaction tube 11 is decompressed at a pressure value in a range from 0.5 Pa to 0.7 Pa by the vacuum pump VP. Subsequently, the combination valve CV is closed, whereas the valves VB3 and VB4 are open. Now, nitrogen gas is supplied from the nitrogen gas sources 36a and 36b into the reaction tube 11, thus, the reaction tube 11 is back into an atmospheric state where the pressure within the reaction tube 11 is a normal value.

Afterwards, the reaction tube 11 is left for a predetermined time period, for example, fifteen minutes or so, and cools down.

Next, the combination valve CV is open, and its opening degree is controlled. The gas within the reaction tube 11 is absorbed at a pressure value of −500 Pa with respect to the pressure (i.e., atmosphere pressure) inside the reaction tube 11. At the same time, as shown in FIG. 2, the elevator mechanism 54 is driven, and the wafer boat 14 is lowered down and unloaded from the reaction tube 11, so that the semiconductor substrates 15 are unloaded.

When the wafer boat 14 is unloaded, NH4Cl attached to a section of the reaction tube 11 whose temperature is low is sublimated when the high-temperature semiconductor substrates 15 after heat-treated pass by the reaction tube 11. The sublimated gas reacts with hydrogen, thereby particles may be produced. However, in employing such an unloading method, as exemparily shown in FIG. 3, the sublimated gas or the particles are gently absorbed and exhausted from the reaction tube 11, without attaching to the semiconductor substrates 15.

The semiconductor substrates 15 are unloaded together with the wafer boat 14 and are removed onto a cassette as needed.

In order to clean the inside of the vertical heat treatment apparatus, the elevator mechanism 54 is lifted up, while the lid 51 is moved upward. The flange 22 of the manifold 17 and the lid 51 are hermetically connected with each other through the "O" ring 52. In a case where to clean the wafer boat 14 together with the inside of the apparatus, the wafer boat 14 from which semiconductor substrates 15 have already been removed is arranged on the heat insulating cylinder 53.

The valve 69 of the pipe 63c so selects a path as the exhaust gas to be exhausted from the second vent 72.

In a state where the vacuum pump VP is activated and the combination valve CV is controlled, the pipe 63a is decompressed at a pressure value in a range from 10 kPa to 30 kPa. The heater 16 heats up the inside of the reaction tube 11 approximately to a temperature of 50° C. The heater of the hot disk trap TRP1 heats up the disks contained in the hot disk trap TRP1 to a temperature approximately between 100° C. to 150° C. The exhaust path heater 65 heats up the pipe 63c and the combination valve CV to a temperature approximately between 100° C. to 150° C.

Next, the valve VB6 is open, so that hydrogen fluoride is supplied to the inlets 64a to 64c for a predetermined time period, for example, ten minutes or so. The hydrogen fluoride so flows into the lower portion of the manifold 17 from the inlet 64a as to clean the lower portion and the inner wall of the inner tube 13, and gradually goes upward to clean the upper portion thereof. The hydrogen fluoride drops down to the gap between the outer tube 12 and the inner tube 13, cleans the outer wall of the inner tube 13 and the inner wall of the outer tube 12, and flows into the exhaust port 61.

The hydrogen fluoride flows onto the upstream side of the bent point of the pipe 63a from the inlet 64b. Furthermore, the hydrogen fluoride flows into the gas intake of the hot disk trap TRP1 from the inlet 64c and flows toward the vacuum pump VP.

By the hydrogen fluoride supplied to the inlets 64a to 64c, the silicon nitride $Si_3N_4$ or the silicon oxide $SiO_2$ which has attached to the inner wall of the reaction tube 11, and the hydrocarbon $C_xH_y$ attached to the lower portion of the manifold 17, the bent portion of the pipe 63a or the inside of the hot disk trap TRP1, are separated (i.e., such portion is cleaned) therefrom and exhausted from the second vent 72 selected by the valve 69 via the vacuum pump VP. At this time, the hydrogen fluoride is scrubbed by the second scrubber 74.

Upon completion of the cleaning, the valve VB6 is so closed the hydrogen fluoride is no longer supplied. Then, the reaction tube 11 is decompressed at a pressure value between 0.5 Pa and 0.7 Pa by the vacuum pump VP. Subsequently, in order to perform purging, the valves VB3 and VB4 are open, and nitrogen gas is supplied into the reaction tube 11 from the nitrogen gas sources 36a and 36b. After repeating this step a few times, the reaction tube 11 is back into an atmospheric state where the pressure within the reaction tube 11 is a normal value.

In the vertical heat treatment apparatus according to the first embodiment of this invention, reactive products produced during the formation of the films can be appropriately removed from the exhaust gas in the heat treatment apparatus which forms a plural types of films. Furthermore, products (main products and reactive sub products) which have attached into the apparatus can easily be removed without breaking down the apparatus. Thus, the apparatus can be utilized with enhanced efficiency, and a decrease in the maintenance cost can be achieved.

At the time of cleaning, mixture gas of hydrogen fluoride and another kind of gas may be supplied into the reaction tube 11 and the exhaust pipe 63. For example, during the cleaning, the valves VB6 and VB3 (or VB4) are so open as to conduct hydrogen fluoride and nitrogen into the reaction tube 11 and the exhaust pipe 63.

The temperature of the reaction tube 11, when cleaning the apparatus, is not limited to 50° C., however, its temperature may set in a range between 30° C. to 200° C. in an appropriate manner and time.

(Second Embodiment)

In the first embodiment, when hydrogen fluoride is so supplied to the inlets 64a to 64c after the formation of the films as to clean the inside of the apparatus, the pressure within the pipe 63a is retained at an appropriate pressure value between 10 kPa and 30 kPa.

In general, when the hydrogen fluoride is so supplied thereto as to clean the apparatus, cleaning the apparatus is advantageously performed when the pressure within the pipe is 10 kPa or higher. In a case where the pressure within the pipe 63a is approximately 20 kPa, attached products are most likely to be removed. However, the pressure is maintained at a given value in a range from 10 kPa to 30 kPa, the hydrogen fluoride hardly reaches a section in which the conductance of the gas is low or a section in which no fresh gas flows, thus, the attached products remains without being removed. For example, the manifold 17 as the lower portion of the reaction tube 11 is formed to be uneven, since the gas supplying pipes 31a to 31c are inserted thereinto, therefore, the hydrogen fluoride gas is not likely to be infiltrated into the manifold 17. The hydrogen fluoride gas is not likely to be infiltrated also into the periphery of the bent portions of the exhaust pipe 63 or joint sections of pipes. Thus, the products (main products or reactive sub products) attached to the inner wall of the manifold 17 or the exhaust pipe 63 remain, that is, such products are not properly and desirably removed.

In the vertical heat treatment apparatus according to the second embodiment of this invention, at the time of cleaning the apparatus, the pressure within the reaction tube 11 is repeatedly fluctuated. This causes the hydrogen fluoride gas to be infiltrated into the reaction tube 11 and the attached products to be appropriately removed therefrom.

The vertical heat treatment apparatus according to the second embodiment has the same structure as that of the vertical heat treatment apparatus according to the first embodiment.

At the time of cleaning the apparatus, likewise in the first embodiment, the elevator mechanism 54 is lifted up, so that the lid 51 is moved upward. Then, the flange 17 and the lid 51 are hermetically connected with each other via the "O" ring 52. In a case where to clean the wafer boat 14 as well together with the inside of the apparatus, the wafer boat 14 from which the semiconductor substrates 15 have already been removed is arranged on the heat insulating cylinder 53.

The valve 69 of the pipe 63c selects a path such that the exhaust gas is exhausted from a second vent 72.

In a state where the vacuum pump VP is activated and the combination valve CV is controlled, the pipe 63c is decompressed into a pressure value of 10 kPa. The heater 16 heats up the inside of the reaction tube 11 approximately to a temperature of 50° C. The heater of the hot disk trap TRP1 heats up the disks contained in the hot disk trap TRP1 to a temperature approximately between 100° C. to 150° C. The exhaust path heater 65 heats up the pipe 63c and the combination valve CV to a temperature approximately between 100° C to 150° C.

Next, the valve VB6 is open, and hydrogen fluoride is supplied into the inlets 64a to 64c for a predetermined time period, for example, ten minutes or so. The hydrogen fluoride flows into the lower portion of the manifold 17 from the inlet 64a, flows into the upstream side of the bent portion of the pipe 63a from the inlet 64b, flows into the gas intake of the hot disk trap TRP1 from the inlet 64c, and flows toward the vacuum pump VP.

By the hydrogen fluoride supplied to the, inlets 64a to 64c, the silicon nitride $Si_3N_4$ and the silicon oxide $SiO_2$ which attaches to the inner wall of the reaction tube 11, or the hydrocarbon $C_xH_y$ attached to the lower portion of the manifold 17, bent portion of the pipe 63a or the inside of the hot disk trap TRP1, is separated (i.e., such portion is cleaned) therefrom, and exhausted from the second vent 72 selected by the valve 69 via the vacuum pump VP.

In this case, the combination valve CV is controlled, and the pressure within the pipe 63a is fluctuated in a range from 0.1 kPa to 30 kPa, for example.

In other words, the opening degree of the combination valve CV is set high, and the vacuum pump VP causes the pipe 63c to be decompressed. After the pipe 63a is decompressed approximately at a pressure value of 0.1 kPa, the opening degree of the combination valve CV is set low, and the pressure within the pipe 63a raises at a pressure value between 20 kPa to 30 kPa.

The range in which the pressure within the pipe 63a is fluctuated is determined by the exhausting performance of the vacuum pump VP. It is preferred that the fluoride hydrogen hydrogen fluoride is infiltrated into the reaction tube 11 or a section of the exhaustion pipe 63 in which the conductance is low. To be specific, the minimum range in which the pressure is fluctuated is not limited to the pressure value of 0.1 kPa. Instead, the minimum range can be set at a pressure value of 2 kPa (1 to 3 kPa), for example, as long as the hydrogen fluoride can be infiltrated and can be removed at that pressure value.

Figure 4:
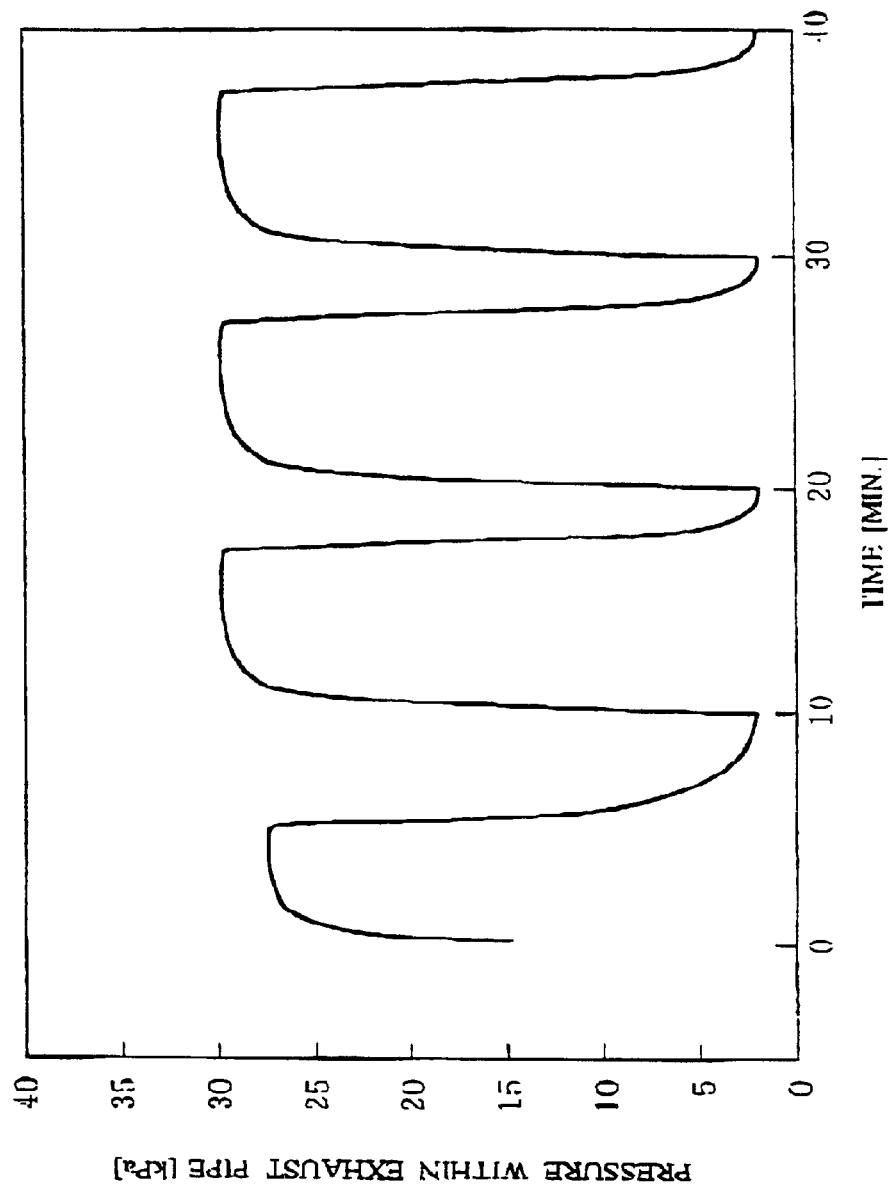
FIG. 4 is a graph illustrating, when cleaning a reaction tube, fluctuations of the pressure within the reaction tube included in a vertical heat treatment apparatus according to the second embodiment of the present invention.

FIG. 4 is a diagram exemplifying a pressure fluctuation of the pipe 63a, when the pressure within the reaction tube 11 is repeatedly fluctuated so as to clean the pipe 11.

In the exemplary illustration, the pressure within the pipe 63a is fluctuated in a range approximately between 2 kPa to 30 kPa. Particularly, the pressure within the pipe 63a is fluctuated in such a way that a period in which the pressure is 10 kPa or higher and a period in which the pressure is lower than 10 kPa are cyclically repeated.

At that time, as explained above, cleaning the apparatus is advantageously performed by supplying the hydrogen fluoride gas when the pressure within the pipe is 10 kPa or higher. It is, therefore, preferred that the combination valve CV and the vacuum pump VP are so controlled that the period in which the pressure within the pipe 63a is 10 kPa or higher can be obtained as long as possible.

If the pressure within the reaction tube 11 is thus fluctuated, the fluoride hydrogen hydrogen fluoride gas is filtrated into a section of the reaction tube 11 or the exhaust pipe 63 in which the conductance is low. Thus, the attached products can effectively be removed.

(Third Embodiment)

The method for removing the hydrogen fluoride gas used for cleaning the apparatus, as described in the first and second embodiments, can also be achieved by alternately repeating supplying and vacuuming nitrogen (purge) gas.

Figure 5:
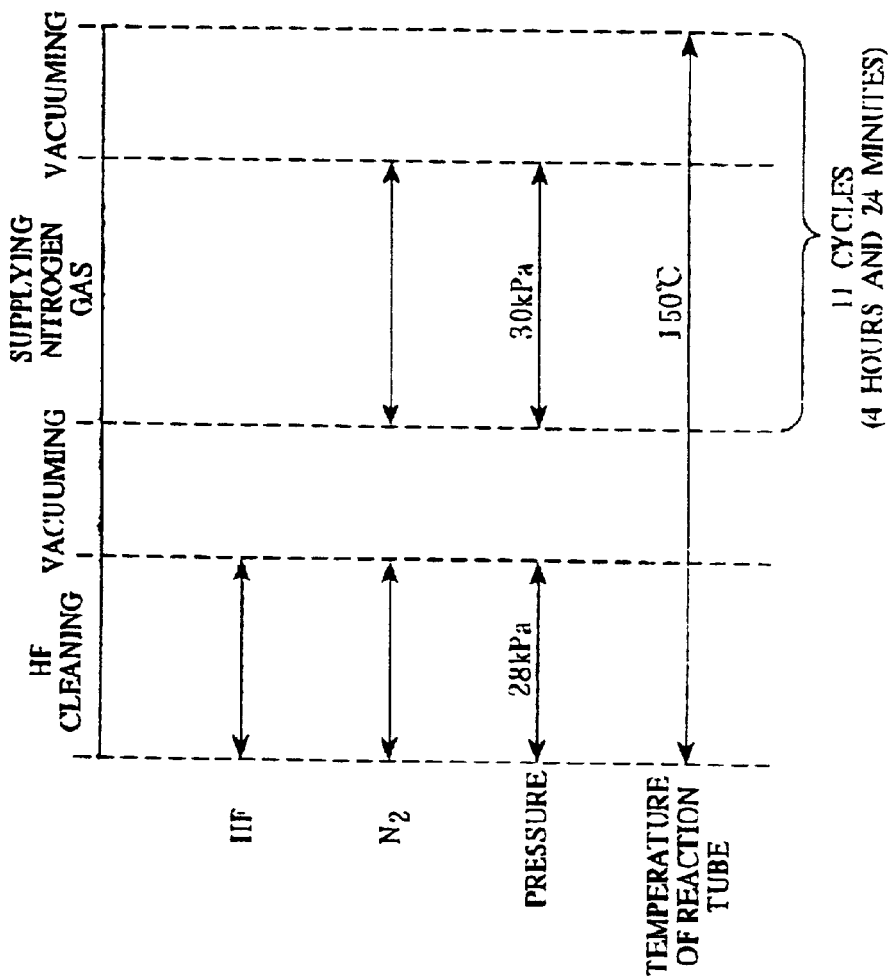
FIG. 5 is a sequence diagram for explaining operations of a vertical heat treatment apparatus according to the third embodiment of the present invention.

For example, as illustrated in the sequence diagram shown in FIG. 5, after cleaning the apparatus with the hydrogen fluoride gas and vacuuming the gas, the cycle of supplying and vacuuming the nitrogen gas is repeated for eleven times (eleven cycles). Then, the hydrogen fluoride gas which remains within the reaction tube 11 and the exhaust pipe 63 can be removed.

The hydrogen fluoride stays in a section, in which the conductance is low, and attaches into the reaction tube 11 and the exhaust pipe 63. It should be noted, therefore, that the hydrogen fluoride gas can not efficiently be removed merely by alternately repeating the cycles of supplying and vacuuming the nitrogen gas. Despite that performing the process shown in FIG. 5 takes approximately five hours (i.e., it is quite time consuming), the hydrogen fluoride of 10 ppm or more remains within the reaction tube 11 and the exhaust pipe 63.

In the vertical heat treatment apparatus according to the third embodiment of this invention, the hydrogen fluoride which remains within the reaction tube 11 after cleaning the pipe can be removed in a short time using alkoxysilane (preferably TEOS).

The vertical heat treatment apparatus according to the third embodiment of this invention has the same structure as that of the vertical heat treatment apparatus of the first and second embodiments.

Figure 6:
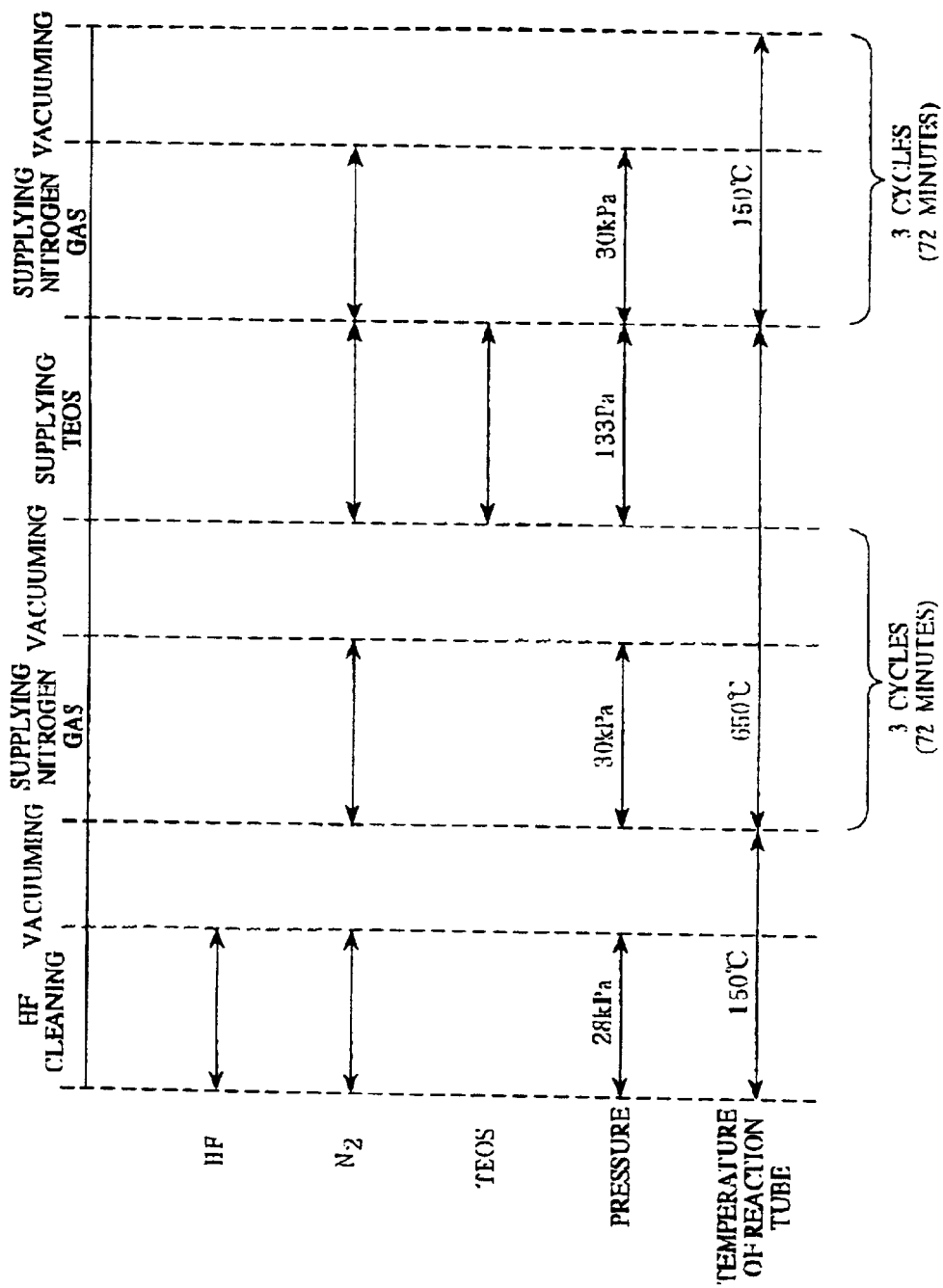
FIG. 6 is another sequence diagram for explaining operations of the vertical heat treatment apparatus according to the third embodiment of the present invention.

FIG. 6 is a sequence diagram showing operations of the vertical heat treatment apparatus for removing the used hydrogen fluoride gas.

An explanation will now be made to the operations of the vertical heat treatment apparatus which are described in the sequence diagram shown in FIG. 6.

In the vertical heat treatment apparatus, after cleaning the inside of the reaction tube 11 and the exhaust pipe 63 using the hydrogen fluoride, the valve VB6 is so closed that the hydrogen fluoride is no longer supplied. Then, the vacuum pump VP is activated, and the reaction tube 11 is decompressed.

Next, while the vacuum pump VP is still activated, the valves VB3 and VB4 are open in order to supply nitrogen gas into the reaction tube 11 from the nitrogen gas sources 36a and 36b. Then, the opening degree of the combination valve CV is controlled, thereby the reaction tube 11 is set back at a pressure value of approximately 30 kPa. The heater 16 heats up the inside of the reaction tube 11 approximately to a temperature of 650° C.

Now, the valves VB3 and VB4 are so closed that the nitrogen gas is no longer supplied into the reaction tube 11. The reaction tube 11 is again decompressed by the vacuum pump VP.

Decompressing the reaction tube 11 and supplying the nitrogen gas thereinto are repeatedly performed for a given number of times, for example, three times (three cycles).

After having thus repeated decompressing the reaction tube 11 and supplying the nitrogen gas thereinto, in a case where the reaction tube 11 is decompressed, the valve VB5 is open so as to supply alkoxysilane (preferably TEOS) into the reaction tube 11 from the third gas source 35c. In a state where the pressure within the reaction tube 11 is controlled approximately at 133 Pa after the opening degree of the combination valve CV is controlled, exhaustion of the gas is continuously performed for a predetermined time period, for example, two minutes or so.

Next, the valve VB5 is closed so that alkoxysilane gas (reactant gas) is no longer supplied, whereas the valves VB3 and VB4 are open so as to supply nitrogen gas into the reaction tube 11 from the nitrogen gas sources 36a and 36b. The opening degree of the combination valve CV is controlled so that the pressure within reaction tube 11 is set back at a pressure value of approximately 30 kPa. Then, the reaction tube 11 is left for a given time period, for example, fifteen minutes or so, thereby cooling down.

Next, after controlling all of the vacuum pump VP, the valves VB3 and VB4 and the combination valve CV, decompressing the reaction tube 11 and supplying the nitrogen gas thereinto are repeatedly performed for a given number of times, for example, three times (three cycles).

By doing this, the hydrogen fluoride which remains within the reaction tube 11 can completely be removed approximately within four hours. In other words, a reduction in the time necessary for removing the reactive products attached to the inside of the pipe can be achieved.

Before or after supplying TEOS into the reaction tube 11, the number of cycles taken to supply the nitrogen gas and to vacuum the gas is not limited to three, and the time required for the three cycles is not limited 72 minutes. Instead, as long as the hydrogen fluoride can be removed, the number of cycles and the continuous time period can arbitrarily be set.

The gas to be supplied for removing the hydrogen fluoride is not limited to alkoxysilane for forming a silicon oxide film, instead, $NH_3$ and $SiH_2Cl_2$ for forming a silicon nitride film can be employed. Gas for forming a film to be formed in the reaction tube 11 can be supplied for removing the hydrogen fluoride.

The present invention is not limited to the above-described first to third embodiment, however various embodiments and changes can be made.

For example, in the above-described embodiments, the combination valve CV is employed for opening and closing a gas-flowing path in a range from the reaction tube 11 to the vacuum pump VP. However, a main valve, a sub valve which opens and closes its own path and a by-pass pipe which is arranged across the main valve may be employed in place of the combination valve CV. In such a structure, the gas is slowly exhausted in the above-described film forming process, or the gas is exhausted when the semiconductor substrates 15 are unloaded. Specifically, the opening degree of the sub valve is adjusted while the main valve is closed, so that the gas can be slowly exhausted or can simply be exhausted even when the semiconductor substrates 15 are unloaded.

The position or section into which the hydrogen fluoride for cleaning the apparatus is conducted can be arbitrarily determined. Inlets are arranged in arbitrary portions, to which products are very likely to attach. Such products are produced while forming the film, because the temperature of the exhaust gas is decreased or the conductance of the exhaust gas is lowered. The hydrogen fluoride stored in the fourth gas source 35d can be conducted into a gas-flowing path through the inlets.

Figure 7:
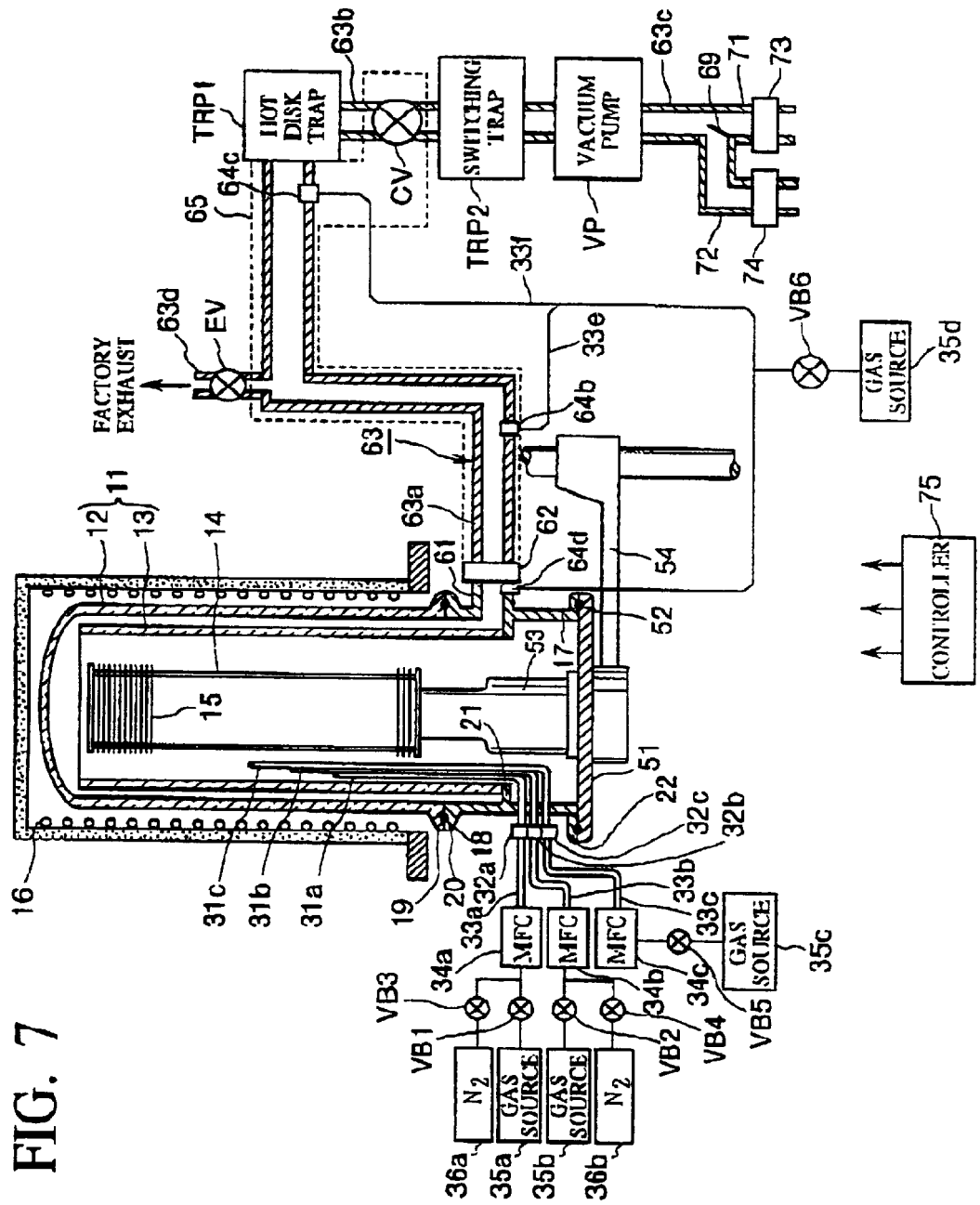
FIG. 7 is a diagram showing a modification of a vertical heat treatment apparatus.

For example, as illustrated in FIG. 7, in place of the inlet 64a, an inlet 64d may be arranged in a position adjacent to the joint 62, so that only the inside of the exhaust port 61 and the exhaust pipe 63 can be cleaned.

Figure 8A:
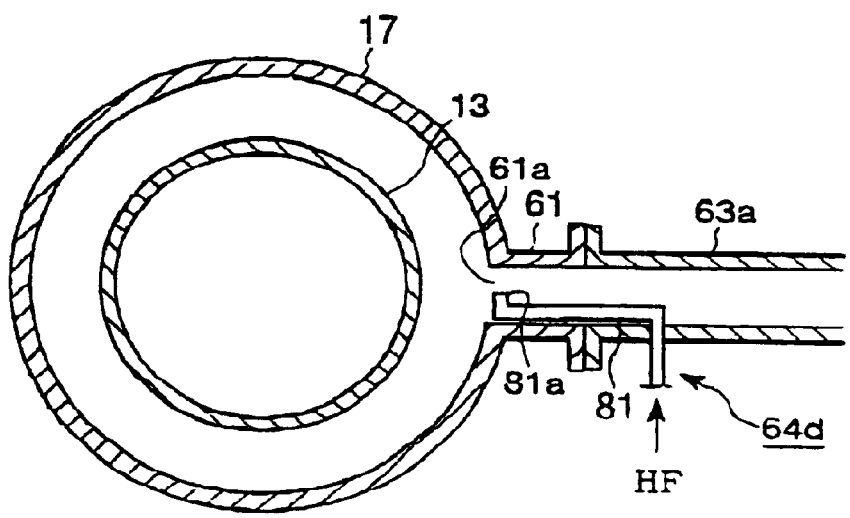
FIGS. 8A and 8B are diagrams for exemplarily explaining the structure of an inlet, more specifically.
Figure 8B:
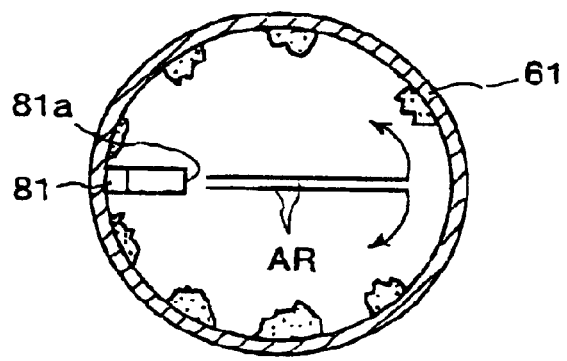

An explanation will now exemplarily be made to the structure of the inlet 64d with reference to FIGS. 8A and 8B. In the examples shown in FIGS. 8A and 8B, an HF introduction pipe 81 included in the inlet 64d is arranged in such a way that it is inserted through a hole formed in the side wall of the exhaust pipe 63a (or the exhaust port 61), and that it stays by an intake 61a of the exhaust port 61 along the inner surface of the exhaust pipe 63a and the exhaust port 61. One end of the HF introduction pipe 81 is bent perpendicularly to the center of the exhaust port 61 in a position adjacent to the opening 61a of the exhaust port 61.

According to this structure, an opening 81a of the HF introduction pipe 81 faces the inner surface of the exhaust port 61. Thus, as shown with arrows AR in FIG. 8B, HF gas supplied from the fourth gas source 35d spouts out from the opening 81a toward the inner surface of the exhaust port 61, and so hits the inner wall as to spread into two, the upstream and down stream sides. As the entire gas flows onto the downstream side by the vacuum pump VP, the spouted HF gas entirely flows onto the downstream side and is supplied into the entire inner wall of the exhaust port 61 and the exhaust pipe 63, resulting in the reactive products being evenly removed. There is a sudden decrease in exhaust conductance of the connected portion of the reaction tube 11 and the exhaust port 61. Therefore, reactive products are very likely to attach into the inner surface of the exhaust port 61. When the inlet 64d is structured as shown in FIGS. 8A and 8B, the reactive products which have attached to the inner surface of the exhaust port 61 can be removed therefrom with efficiency. The HF gas does not directly hit the inner wall of the inner tube 13, thereby preventing the side wall of the inner tube 13 from being etched.

It is also possible that the inlet 64d have any one of the structures shown in FIGS. 9 to 12.

Figure 9:
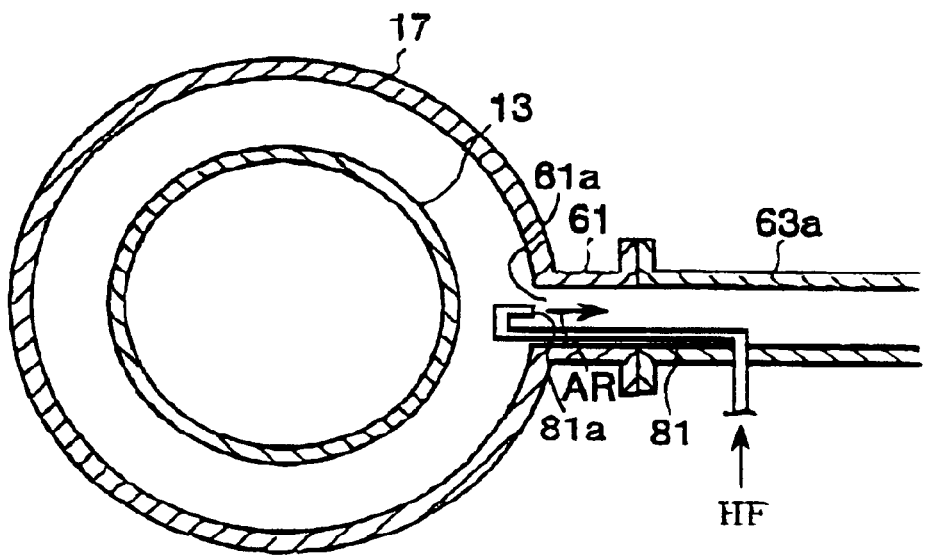
FIGS. 9 and 10 are diagrams for exemplarily explaining the structure of an inlet, and each illustrating a cross sectional view of a manifold and an exhaust pipe.

In the structure shown in FIG. 9, the HF introduction pipe 81 is arranged in such a way that it is inserted from a pipe wall of the exhaust pipe 63a, and that its one end is bent in a position which is slightly on the upstream side relative to the intake 61a of the exhaust port 61. The opening 81a of the HF introduction pipe 81 faces the downstream in a position facing the intake 61a of the exhaust port 61.

Figure 10:
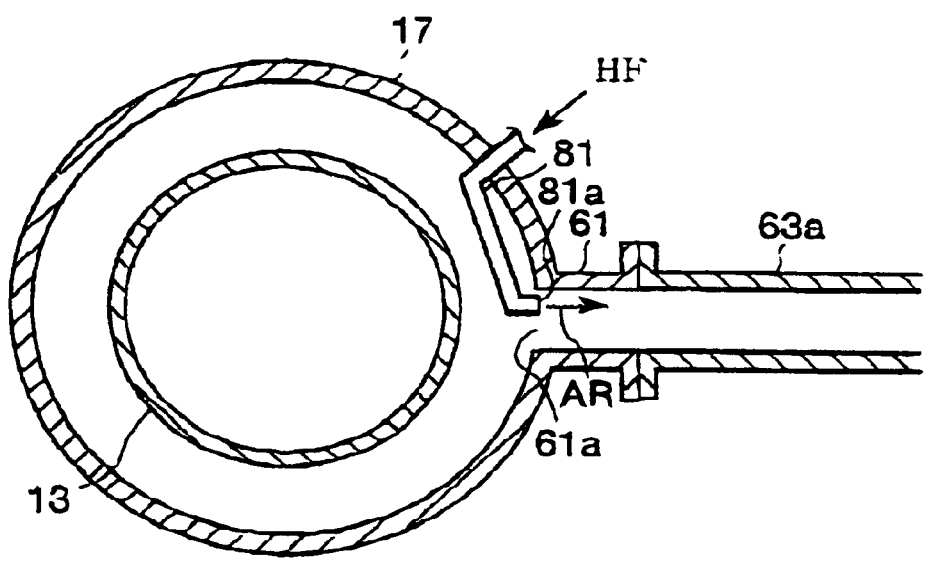

In the structure shown in FIG. 10, the HF introduction pipe 81 is inserted from the side wall of the manifold 17. The opening 81a of the HF introduction pipe 81 arranged along the inner wall of the manifold faces the intake 61a of the exhaust port 61.

Figure 11:
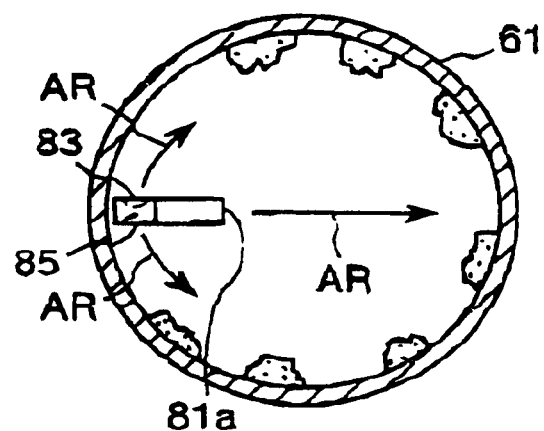
FIGS. 11 and 12 are diagrams for exemplarily explaining the structure of an inlet, and each illustrating a cross sectional view of an exhaust port.

In the structure shown in FIG. 11, two holes 83 and 85 for discharging HF gas are formed right in a part where the HF introduction pipe 81 is perpendicularly bent. In such a structure, HF gas can be supplied along the inner surface of the exhaust port 61, therefore, reactive products which have attached to the inner wall of the exhaust port 61 can be removed with efficiency. The inlet 64d may be structured such that the opening 81a is so closed as HF gas to spout out from the two holes 83 and 85.

Figure 12:
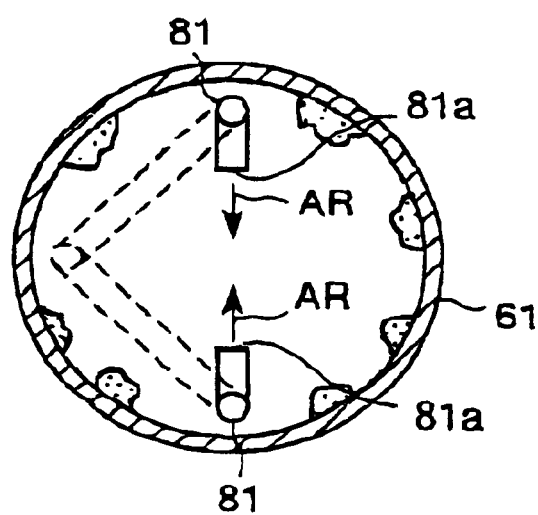

In the structure shown in FIG. 12, the end of the HF introduction pipe 81 is split into two, so that HF gas can be supplied from the two split ends in the two opposite direction, thereby promoting efficiency with which reactive products are removed therefrom.

The structure shown in FIGS. 8A and 8B, 9 or 10 and the structure shown in FIG. 11 or 12 are possibly combined. For example, the HF introduction pipe 81 is formed with the structure, shown in FIGS. 8A and 8B, or FIG. 9 or 11, in which two holes are arranged in its end. In doing this, HF gas can be supplied axially along the exhaust port 61 or in a plurality of directions along the inner surface.

The number of inlet(s) and the position where the inlet is arranged are not limited to those described in the structure shown in FIG. 1 or 7. For example, there can be arranged only one inlet 64, along which hydrogen fluoride is inserted into the reaction tube 11, thereafter cleaning the exhaust pipe 63 with the hydrogen fluoride flowing from the reaction tube 11.

In the third embodiment, film-forming gas to be supplied when exhausting hydrogen fluoride may be supplied into the reaction tube 11 and/or the exhaust pipe 63 from a pipe which is not the one for supplying film-forming gas when forming films.

A single water-cooled trap which is substantially the same as that included in the switching trap TRP2 may be arranged in place of the switching trap TRP2, for example.

The pipe which serves as a joint connecting the hot disk trap TRP1 to the combination valve CV and the pipe which serves as a joint connecting the combination valve CV to the switching trap TRP2 may be heated to a temperature in a range between 100° C. to 150° C., during the same period of time as the exhaust path heater 65 performs heating. Thus, hydrocarbon $C_xH_y$ or $NH_4Cl$ are not likely to attach into such pipes.

In the above-described embodiments, while the gas is exhausted by means of the vacuum pump VP, the semiconductor substrates 15 are loaded or unloaded into the reaction tube 11. However, the method for exhausting the gas within the reaction tube 11 is arbitrary. For example, when loading/unloading the wafer boat 14, the combination valve CV is closed, whereas the factory exhaust valve EV is open. In this case, the gas within the reaction tube 11 may be controlled by a damper so that the gas pressure thereof is −50 to −700Pa with respect to the atmosphere pressure.

In the above-described embodiments, explanations have been made to an example, in which a silicon nitride film is formed by a reaction of ammonia and a silicon compound and a silicon oxide film is formed by resolving alkoxysilane. However, source gas is arbitrary, and any other source gas can be used.

This invention is not limited to the case where a silicon nitride film and the silicon oxide film are formed, instead, is applicable to any other various film-forming processes. For example, this invention can be used when forming a TiN film on a substrate to be heat-treated by a reaction of $TiCl_4$ gas and $NH_3$ gas ($NH_4Cl$ is produced as a reactive sub product), and when using an organic silicon compound as source gas other than alkoxysilane, and further when forming a thin film other than a multi-layered insulating film.

In the above-described embodiments, an explanation has exemplarily been made to the heat treatment apparatus for forming a film on the semiconductor substrate (semiconductor wafer). However, this invention is applicable to an apparatus for forming a film on an arbitrary object to be heat-treated, such as a glass substrate, etc.

Figure 13:
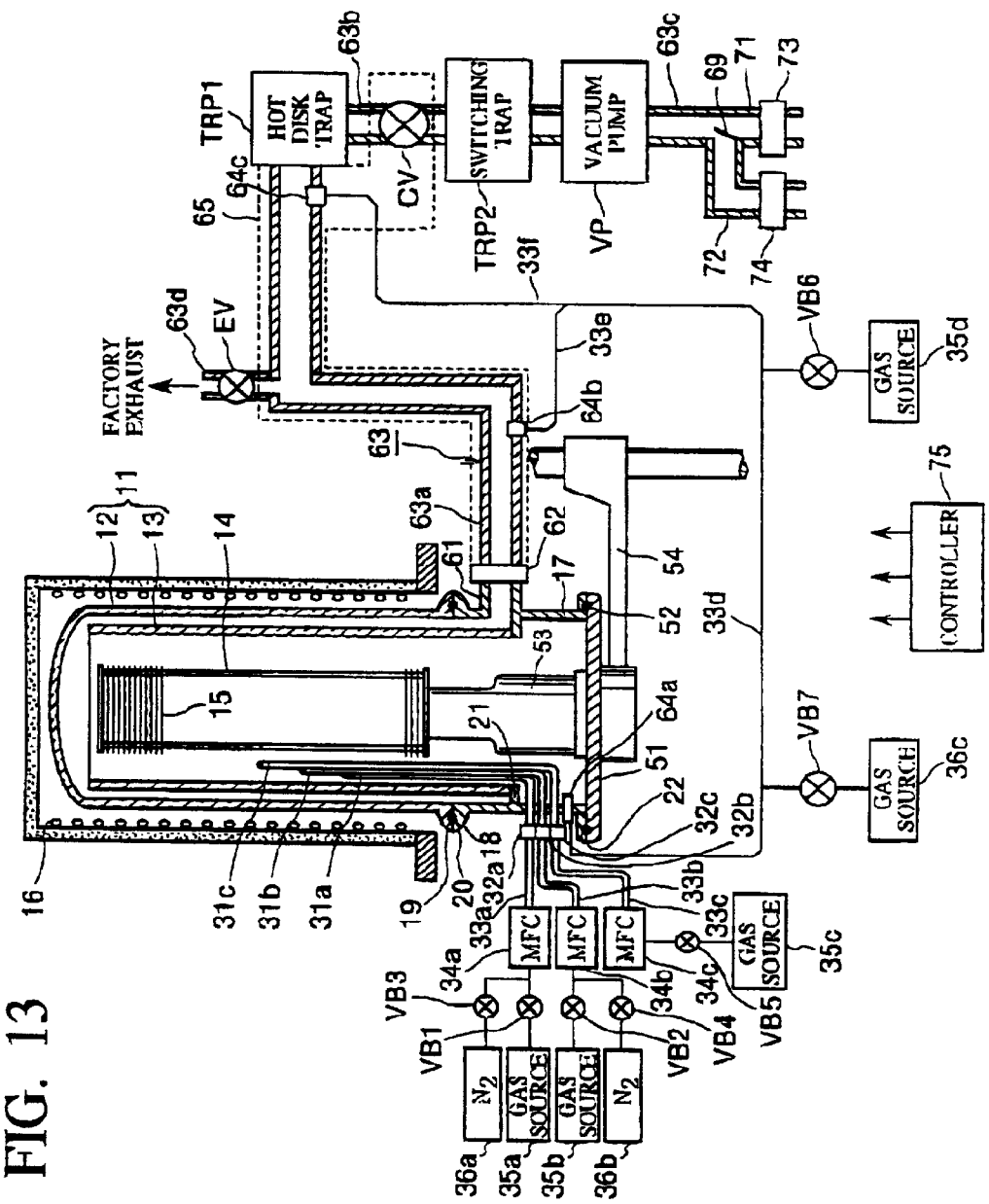
FIG. 13 is a diagram showing a modification of a vertical heat treatment apparatus according to an embodiment of the present invention.

In the above-described embodiments, an explanation has been made to an example in which nitrogen gas is supplied from the nitrogen gas sources 36a and 36, however, the method of supplying the nitrogen gas is not limited to the above. For example, as shown in FIG. 13, the gas pipe 33d may be connected to the nitrogen gas source 36c through the valve VB7, so that the opening degree of the valve VB7 is controlled by the controller, thereby supplying the nitrogen gas therethrough.

Various embodiments and changes may be made thereonto without departing form the board spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-337879 filed on Nov. 27, 1998 and including specification, claims, drawings and summary. The disclosure of the above Japanese Patent Applacation is incorporated herein by reference in its entirety.

What is claimed is:

1. A method of cleaning at least one of a reaction tube which is included in a heat treatment apparatus and an exhaust pipe which is connected to the reaction tube, said method comprising:

loading an object to be heat-treated into the reaction tube;

forming a first film on the object by supplying a first reactant gas into the reaction tube;

forming a second film on the object after stopping supplying the first reactant gas into the reaction tube and supplying second reactant gas which differs from the first reactant gas; and removing a product produced in said first film-forming step and a product produced in said second film-forming step which attach to at least one of the reaction tube and the exhaust pipe, by exhausting gas contained in the reaction tube through the exhaust pipe and supplying hydrogen fluoride gas into at least one of the reaction tube and the exhaust pipe via a plurality of inlets which are connected to parts of the reaction tube and exhaust pipe where conductance of a gas-flowing path is relatively lower to thereby clean at least one of the reaction tube and the exhaust pipe.

2. The cleaning method according to claim 1, further comprising:

raising the temperature of the reaction tube and heating up the exhaust pipe in a range from 100 to 200° C.; and maintaining the pressure within the exhaust pipe in a range between 10 kPa to 30 kPa.

3. The cleaning method according to claim 1, comprising cleaning at least one of the reaction tube and the exhaust pipe by supplying hydrogen fluoride gas thereinto while controlling the pressure within the exhaust pipe to be fluctuated in a range between 0.1 kPa and 30 kPa.

4. The cleaning method according to claim 1, comprising:

removing impurities being exhausted in a plurality of positions of the exhaust pipe by a trap; and controlling pressure of hydrogen fluoride gas in a position between the plurality of traps, by controlling an opening degree of a gas-flowing path of the exhaust pipe.

5. The cleaning method according to claim 1, said method including a removing step of further comprising removing hydrogen fluoride gas by;

decompressing the exhaust pipe, after stopping supplying the hydrogen fluoride gas;

supplying film-forming gas into at least one of the reaction tube and the exhaust pipe, after repeating supplying purge gas and decompressing the exhaust pipe for a given number of times; and repeating supplying purge gas and decompressing the exhaust pipe for a predetermined number of times.

6. The cleaning method according to claim 5, wherein:

the purge gas comprises nitrogen gas; and the film-forming gas includes alkoxysilane.

7. The cleaning method according to claim 1, wherein:

said film-forming step includes forming a silicon oxide film on an object to be heat-treated, film by resolving alkoxysilane;

said second film-forming step includes forming a silicon nitride film on the object, by a reaction of ammonia and a silicon compound;

said cleaning step includes exhausting the reaction tube through the exhaust pipe and supplying hydrogen fluoride into at least one of the reaction tube and the exhaust pipe, thereby removing a reactive product which is produced by resolving alkoxysilane and a reactive produce which is produced by a reaction of ammonia and a silicon compound and both of which attach to at least one of the reaction tube and the exhaust pipe.

8. The cleaning method according to claim 1, wherein:

the exhaust pipe is split into first and second vents at a downstream side of the gas flowing path of the exhaust pipe relative to the reaction tube; and said cleaning step includes conducting exhaust gas into one of said vents in which a scrubber for scrubbing the hydrogen fluoride gas is disposed when the hydrogen fluoride gas is exhausted, and conducting exhaust gas into the other of said vents when no hydrogen fluoride gas is exhausted, by using a valve which is arranged between said one vent and said other vent.

9. The cleaning method according to claim 1, wherein:

said cleaning step includes measuring pressure in the reaction tube and the exhaust pipe and controlling an opening degree of the gas-flowing path of the exhaust pipe to control the pressure at a desired value by a pressure control valve which is arranged in the exhaust pipe.

10. The cleaning method according to claim 1, wherein:

said cleaning step includes heating up the exhaust pipe to a temperature in a range of 100° C. to 150° C., whereby supplying the hydrogen fluoride gas to the reaction tube and the exhaust pipe.

11. A method of cleaning at least one of a reaction tube which is included in a heat treatment apparatus and an exhaust pipe which is connected to the reaction tube said method comprising:

loading an object to be heat-treated into the reaction tube;

forming a first film on the object by supplying a first reactant gas into the reaction tube;

forming a second film on the object after stopping supplying the first reactant gas into the reaction tube and supplying second reactant gas which differs from the first reactant gas;

removing a product produced in said first film-forming step and a product produced in said second film-forming step which attach to at least one of the reaction tube and the exhaust pipe, by exhausting gas contained in the reaction tube through the exhaust pipe and supplying hydrogen fluoride gas into at least one of the reaction tube and the exhaust pipe; and controlling pressure within the exhaust pipe to be fluctuated in such a way that a period at which the pressure is 10 kPa or higher and a period at which the pressure is less than 10 kPa are cyclically repeated, and that the period at which the pressure is 10 kPa or higher can be obtained longer than the period at which the pressure is less than 10 kPa.

12. A method of cleaning at least one of a reaction tube which is included in a heat treatment apparatus and an exhaust pipe which is connected to the reaction tube, said method comprising:

loading an object to be heat-treated into the reaction tube;

forming a first film on the object by supplying a first reactant gas into the reaction tube;

forming a second film on the object after stopping supplying the first reactant gas into the reaction tube and supplying second reactant gas which differs from the first reactant gas; and removing a product produced in said first film-forming step and a product produced in said second film-forming step which attach to at least one of the reaction tube and the exhaust pipe, by exhausting gas contained in the reaction tube through the exhaust pipe with a gas-flowing path of the exhaust pipe being opened and closed pressure in the reaction tube and the exhaust pipe being controlled, and supplying hydrogen fluoride gas into at least one of the reaction tube and the exhaust pipe.

* * * * *